United States Patent [19]

Voss et al.

[11] Patent Number: 4,921,054
[45] Date of Patent: May 1, 1990

[54] WIRING BOARD

[75] Inventors: Forrest L. Voss; Donald R. Witherell, both of Cedar Rapids, Iowa

[73] Assignee: Rockwell International Corporation, El Segundo, Calif.

[21] Appl. No.: 278,295

[22] Filed: Oct. 21, 1988

Related U.S. Application Data

[62] Division of Ser. No. 149,797, Jan. 29, 1988, Pat. No. 4,830,704.

[51] Int. Cl.$^5$ .............................................. H05K 1/00
[52] U.S. Cl. ...................................... 174/255; 29/846; 174/256
[58] Field of Search ....................... 174/68.5; 361/414; 156/629, 630, 634, 652, 645, 656, 659.1, 664, 669, 668, 901, 902, 150, 151; 29/846, 852; 430/313, 317, 318; 427/96–98

[56] References Cited

U.S. PATENT DOCUMENTS

| | | | |
|---|---|---|---|
| 3,514,538 | 5/1970 | Chadwick et al. | 174/68.5 |
| 4,522,667 | 6/1985 | Hanson et al. | 174/68.5 X |
| 4,657,825 | 4/1987 | Kanda et al. | 428/660 X |
| 4,711,804 | 12/1987 | Burgess | 174/16.3 X |
| 4,771,365 | 9/1988 | Cichocki et al. | 361/387 |
| 4,791,248 | 12/1988 | Oldenettel | 427/97 X |
| 4,810,563 | 3/1989 | DeGree et al. | 428/458 X |
| 4,830,704 | 5/1989 | Voss et al. | 156/151 X |

OTHER PUBLICATIONS

Boccia, L. J.; Constructing PWB's with Copper-Invar-Copper; PC Fab; 7/86; pp. 34–49.
New Board Overcomes TCE Problems; Electronic Packaging & Production; 11/86; pp. 48–50.

*Primary Examiner*—Morris H. Nimmo
*Attorney, Agent, or Firm*—Gregory G. Williams; M. Lee Murrah; H. Fredrick Hamann

[57] ABSTRACT

A multi-layered printing wiring board and a method for manufacture where the multi-layered printing wiring board has a thermal expansion controller Copper-Invar-Copper core therein with portions of the invar core therein with portions of the Invar being selectively removed and replaced with superior materials for plating conductive material there to and further having a reduced coefficient of thermal conductivity by providing for a noble metal layer to be selectively deposited on pre-determined positions on the Copper-Invar-Copper core thereby selectively etching portions of the copper and Invar up to the noble metal layer and thereby providing for selectively removing the Invar and replacing it with a laminant material.

6 Claims, 5 Drawing Sheets

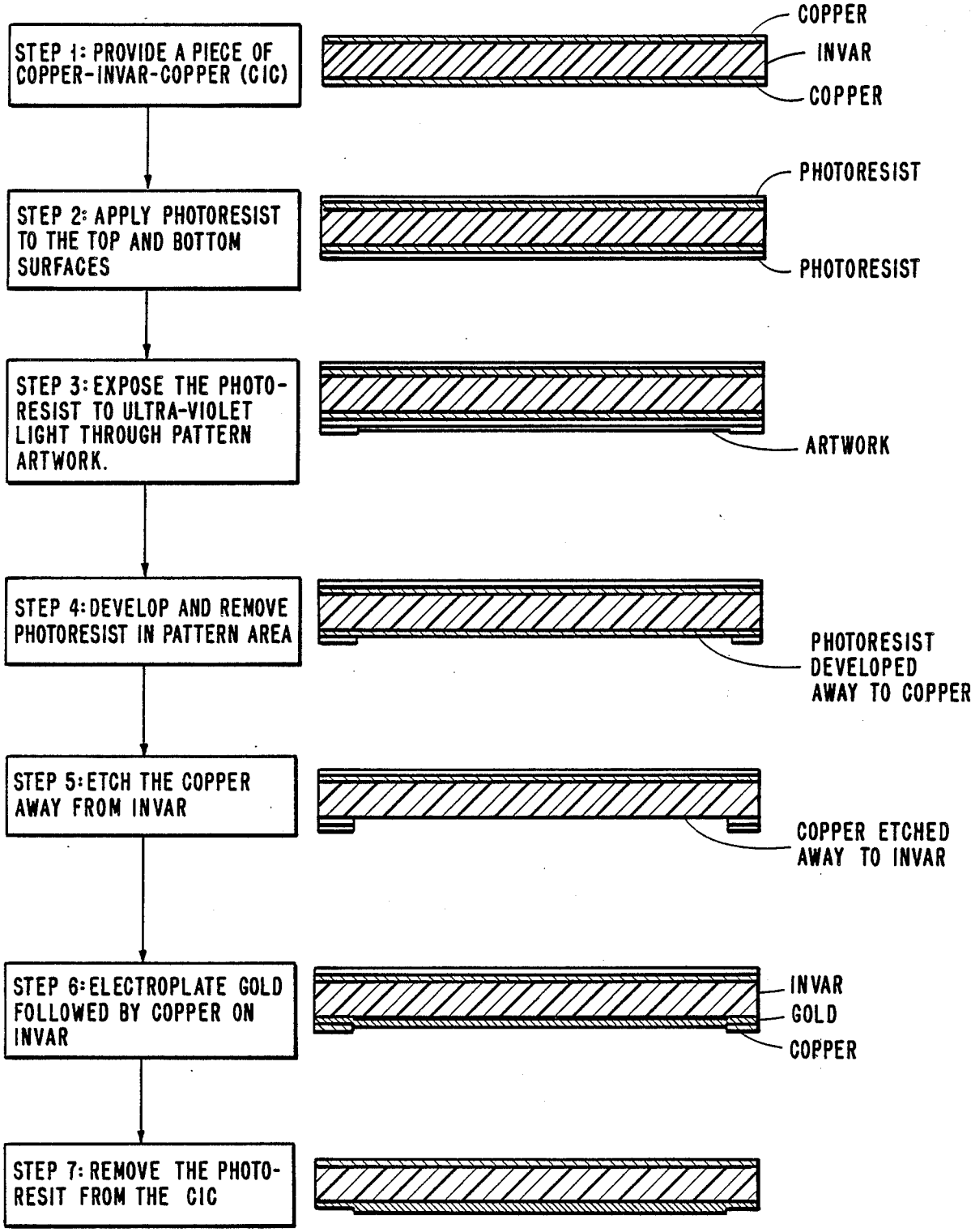

WIRING BOARD

This application is a division of U.S. application No. 07/149,797 filed 1/29/88, now U.S. Pat. No. 4,830,704.

BACKGROUND OF THE INVENTION

This invention generally relates to wiring boards, and more particularly is concerned with printed wiring assemblies PWAs with controlled thermal expansion characteristics.

In today's aviation industry, it is common for a single aircraft to be subjected to several extreme thermal conditions in a relatively short time interval. It is not uncommon for an aircraft to be flying at an altitude of 40,000 feet with an outside temperature of less than −40° F., while only moments earlier it was waiting for a take-off clearance from a hot, humid airport runway. With the current aspirations for trans-atmospheric aircraft, these extreme vicissitudes in the ambient temperature will continue to confront avionics engineers with perplexing problems of increasing difficulty and importance.

One particular problem that is exacerbated by these temperature oscillations is the frequent failure of solder connections between the leads of surface mounted devices (SMD's) and the corresponding pads of printed wiring boards (PWB's). With such PWAs, temperature swings cause the solder joint between the SMD and the PWB to be subjected to a series of stresses. Typically, the PWBs are of a glass/epoxy laminate or other non-conductive material which has a different coefficient of thermal expansion from the SMDs, which are normally fabricated from ceramic materials. This difference in expansion coefficients results in differing degrees of expansion to occur and the intermediate solder joint to be stressed. This problem is increasingly prevalent in PWAs having large multi-leaded SMDs thereon. Larger SMDs typically have many leads which are very small in comparison to the overall size of the SMD. Furthermore, the lead sizes are not typically changed when the overall size of the SMD is increased; therefore, the ratio of the largest linear dimension of the SMD, which is typically directly related to the stress intensity upon the joint, compared with the lead size, increases whenever the overall size of the SMD increases. Ultimately, the series of differential expansion and contraction places sufficient cumulative stress on the intermediate solder joint to cause both mechanical and electrical failure to occur in large SMDs.

Several alternative methods have been used in attempts to extend the number of cycles before failure in temperature cycling. One method has been tried where the SMDs are attached to a conventional PWB, but in addition, a layer of copper-Invar-copper (CIC) is inserted near the top and bottom surfaces with the SMDs being mounted on either side. CIC has a thermal coefficient of expansion which is almost equal to that of the SMD. This "brute force" approach actually limits the differential expansion that can occur, because the wiring board is physically bound to, and restricted from excess expansion by, the underlying CIC.

Frequently, the metal chosen is copper coated Invar. When the copper coated Invar is used as an expansion controlling metal it becomes necessary to drill a hole through the CIC in order to create the plated through holes which interconnect the several layers of a multi-layered board.

While this method has been used extensively in the past it does have several serious drawbacks. One major problem with utilizing Copper-Invar-Copper inserted in a multi-layered wiring board and drilling holes to provide an interconnect between the several layers is that it is frequently difficult to achieve good plating to the Invar surface. If faults in plating to the Invar surface occur it may cause a failure in the wiring board performance. Another problem with such boards is that the exposed Invar layer in the holes can act as a heat sink and thereby cause additional heating to be required when soldering takes place.

Consequently, there exists a need for a method to interconnect CIC within a multi-layered wiring board so that it has a high degree of reliability.

SUMMARY OF THE INVENTION

It is an object of the present invention to provide mult-layered wiring boards, with thermal expansion controlling CIC therein, which has improved reliability in the plating of the interconnect between the several layers within the boards.

It is a feature of this invention to selectively remove the Invar and retain copper to provide a reliable interconnect in the plated hole.

It is an advantage of the present invention to provide for the substitution of a material for another which has superior properties in relation to their ability to be plated by conductive materials.

It is another advantage of the present invention to provide for the substitution of a material for another which has a reduced coefficient of thermal conductivity and thereby minimizing the heat sink affect of the CIC during soldering operations which may cause problems associated with high thermal exposure.

The present invention provides a multi-layered printed wiring board with thermal expansion controlling CIC therein with portions of the Invar being selectively removed and replaced with superior materials for plating conductive materials thereto and further having a reduced coefficient of thermal conductivity which was designed to satisfy the aforementioned needs, contain the above described features, and produce the previously stated advantages. The invention is a "non plated Invar" board in the sense that there is no plating to Invar occurring in the process of creating plated through holes in the interconnect scheme.

Accordingly, the present invention relates to printed wiring boards with thermal expansion controlling CIC therein where a portion of the thermal expansion controlling Invar has been precisely and selectively removed and replaced with materials with superior plating and thermal characteristics.

BRIEF DESCRIPTION OF THE DRAWINGS

The invention may be more fully understood by reading the following description of the preferred embodiments of the invention in conjunction with the appended drawings wherein:

FIG. 3 is a flow chart of steps 1–7 in the method of this invention for constructing a selective copper gold Invar copper layer, together with an illustrative cross-sectional view of the board of each step.

DETAILED DESCRIPTION

Copper-Invar-Copper printed wiring boards have been used throughout the industry for several years. An article entitled "Constructing PWB's with Copper-Invar-Copper" appears in PC Fab, July 1986 from pages 34–49 which is incorporated herein by this reference.

Figure 1:
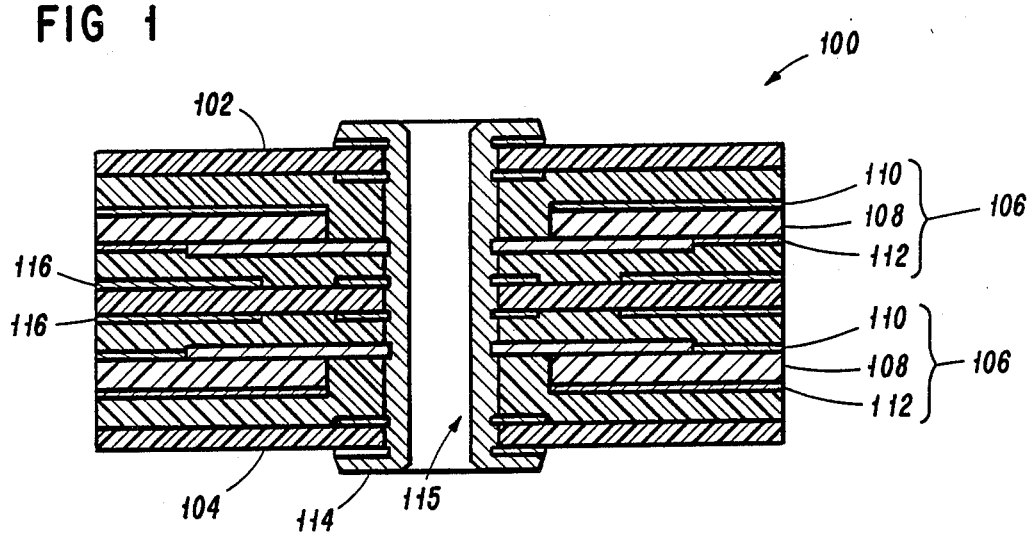
FIG. 1 is a schematic cross-sectional representation of a multi-layered printed wiring board of the present invention having two metallic layers inserted therein and further having a plated through hole therethrough.

Now referring to the drawings and more particularly to FIG. 1, there is shown a multi-layered printed wiring board, of the present invention, generally designated 100, which has a top-side 102 and a bottom side 104. Wiring board 100 is shown having a plated through hole (PTH) therethrough with conductive plating 114 extending from the top-side 102 through the PTH to the bottom side 104. Wiring board 100 having a Copper-Invar-Copper layer 106 disposed therein for the purpose of limiting the thermal expansion, replacing copper ground or power circuits, and shielding copper circuits 116 of the wiring board 100.

Printed wiring board 100 has a first CIC layer 106 therein that preferably consists of a Invar portion 108 positioned between a top roll-bonded copper layer 110 and a bottom copper roll-bonded copper layer 112. The CIC extends throughout the printed wiring board 100 with clearances in the copper-Invar portion of the Copper-Invar-Copper 106 appearing at the predetermined positions of the PTH's. The Invar 106 has a copper and gold layer 115 electroplated on a selected portion of the Invar.

Figure 2:
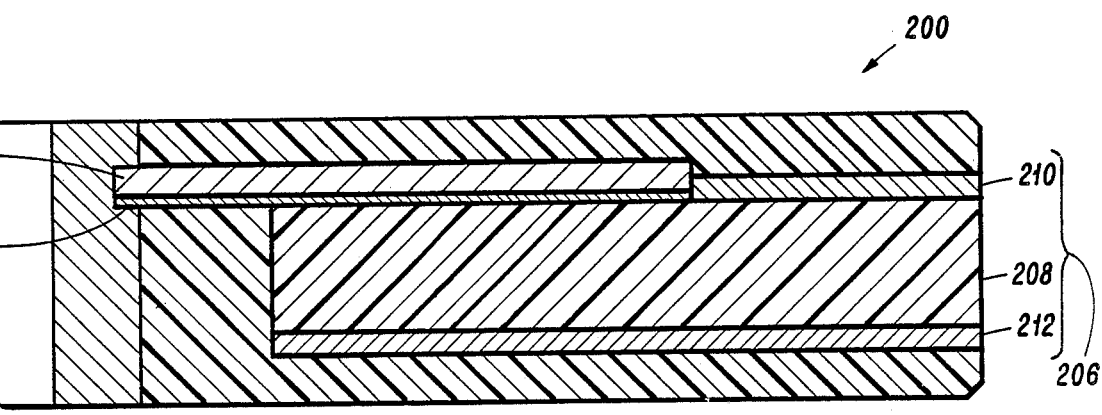
FIG. 2 is a further enlarged schematic cross-sectional representation of a portion of the metallic core in the wiring board of FIG. 1.

Now referring to FIG. 2 there is shown an enlarged section of the printed wiring board, generally designated 200, where the Invar layer 206 has a top layer of roll-bonded copper 210 and at selected positions has an electroplated gold layer 215A, on top of which is an electroplated copper layer 215B.

Now referring to FIG. 3 there is shown a flow chart of the process steps of the invention present invention to selectively apply a gold barrier layer to the invar layer of Copper-Invar-Copper for use in a sub-assembly of a printed wiring board. The steps include:

Step 1. provide a piece of CIC, with the Invar having a top roll-bonded copper surface and a bottom roll-bonded copper surface. Step 2. clean the CIC and apply photoresist to the top and bottom surfaces. Step 3. expose the photoresist to ultra-violet light through a pre-determined patterned artwork. Step 4. develop and remove the non-polymerized photoresist in the patterned area. Step 5. etch the copper from the top surface of the CIC down to the Invar preferably with an alkaline based etchant. Step 6. electroplate gold followed by the copper on the now exposed Invar. Step 7. remove the photoresist from the CIC piece.

Figure 4A:
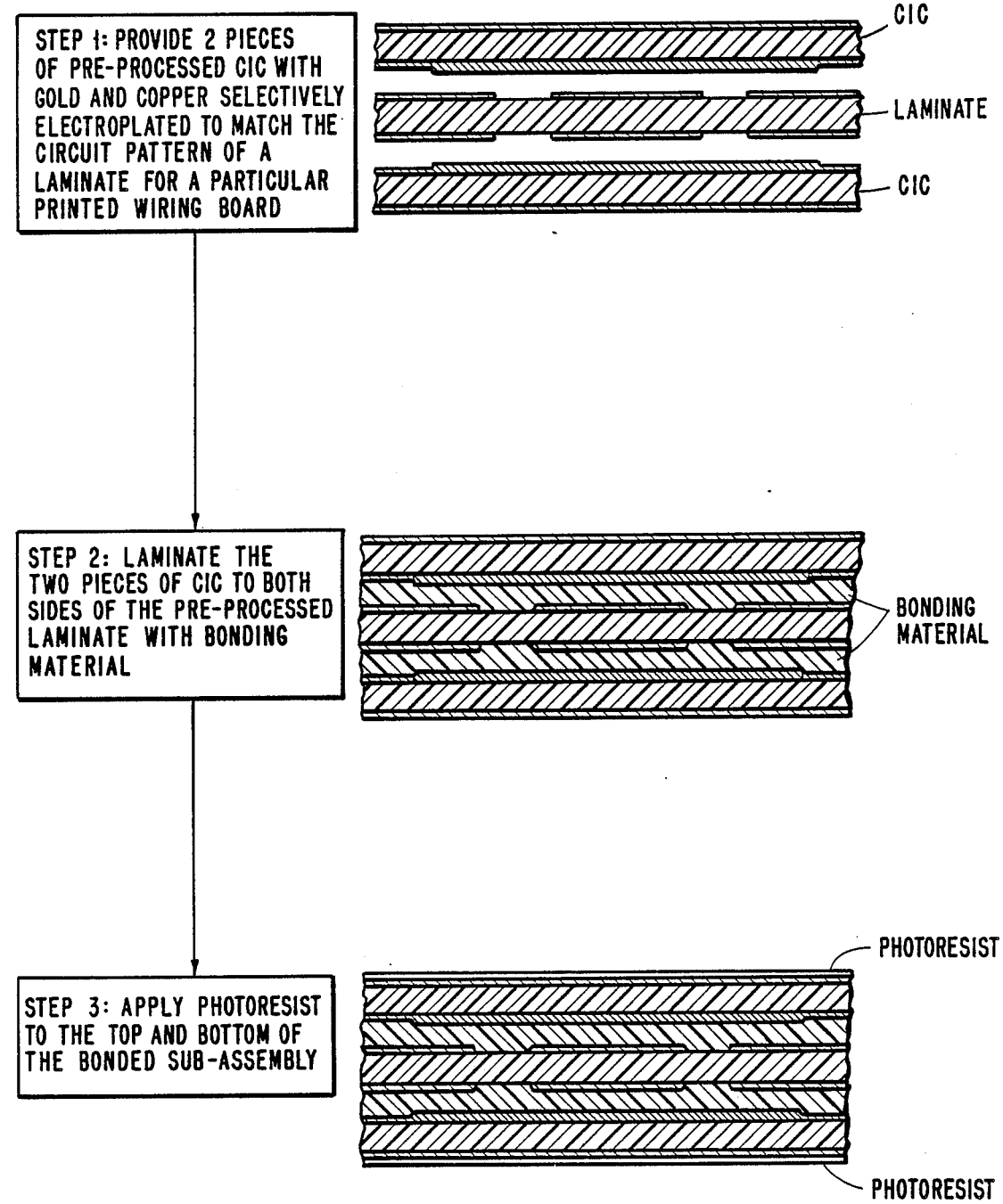
FIG. 4A is a flow chart representation of steps 1–3 in the method of this invention for constructing the multi-layered wiring board of the present invention, together with an illustrative cross-sectional view of the board of each step.
Figure 4B:
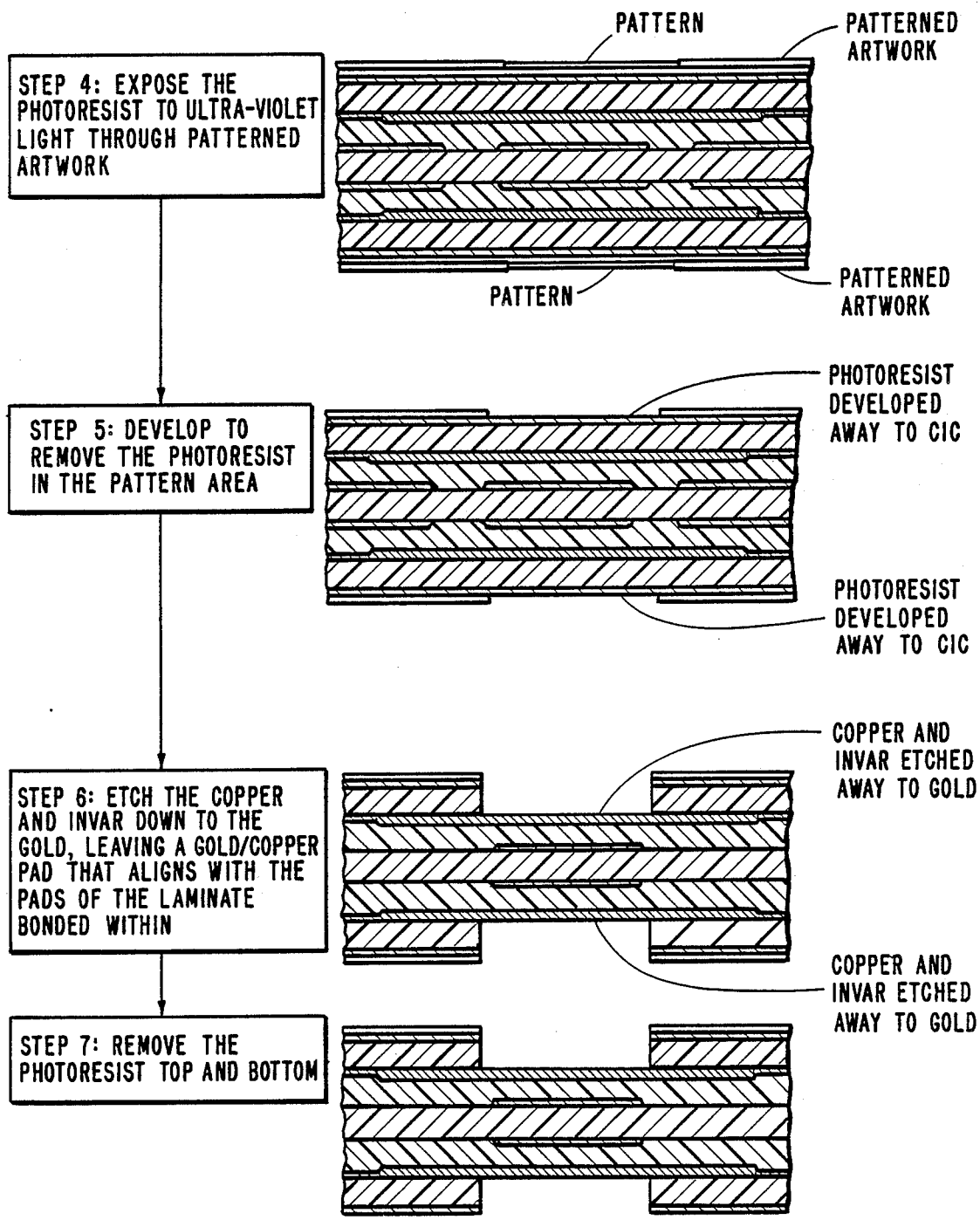
FIG. 4B is a flow chart representation of steps 4–7 in the method of this invention for constructing the multi-layered wiring board of the present invention, together with an illustrative cross-sectional view of the board of each step.

Now referring to FIGS. 4A and 4B there is shown a flow chart of the continuing process steps of the present invention to selectively remove copper and Invar from pre-processed Copper-Invar-Copper that contains a gold barrier layer to fabricate a sub-assembly for use within a printed wiring board. The steps include:

Step 1, provide two pieces of pre-processed CIC containing a gold barrier layer and a copper layer in a predetermined patterned area and also provide pre-processed circuits for a particular printed wiring board. Step 2, laminate the pre-processed CIC layers over the pre-processed matching circuit laminates to create a sub-assembly. Step 3, clean and apply photoresist to the top and bottom CIC layers of the printed wiring board sub-assembly. Step 4, expose the photoresist to ultra-violet light through a predetermined patterned artwork. Step 5, develop and remove the non-polymerized photoresist in the patterned area. Step 6, etch the copper and Invar from the top and bottom pre-processed CIC layers down to the gold barrier with Ferric Chloride etchant leaving a gold/copper pad. Step 7, remove the photoresist from the CIC sub-assembly.

Figure 5:
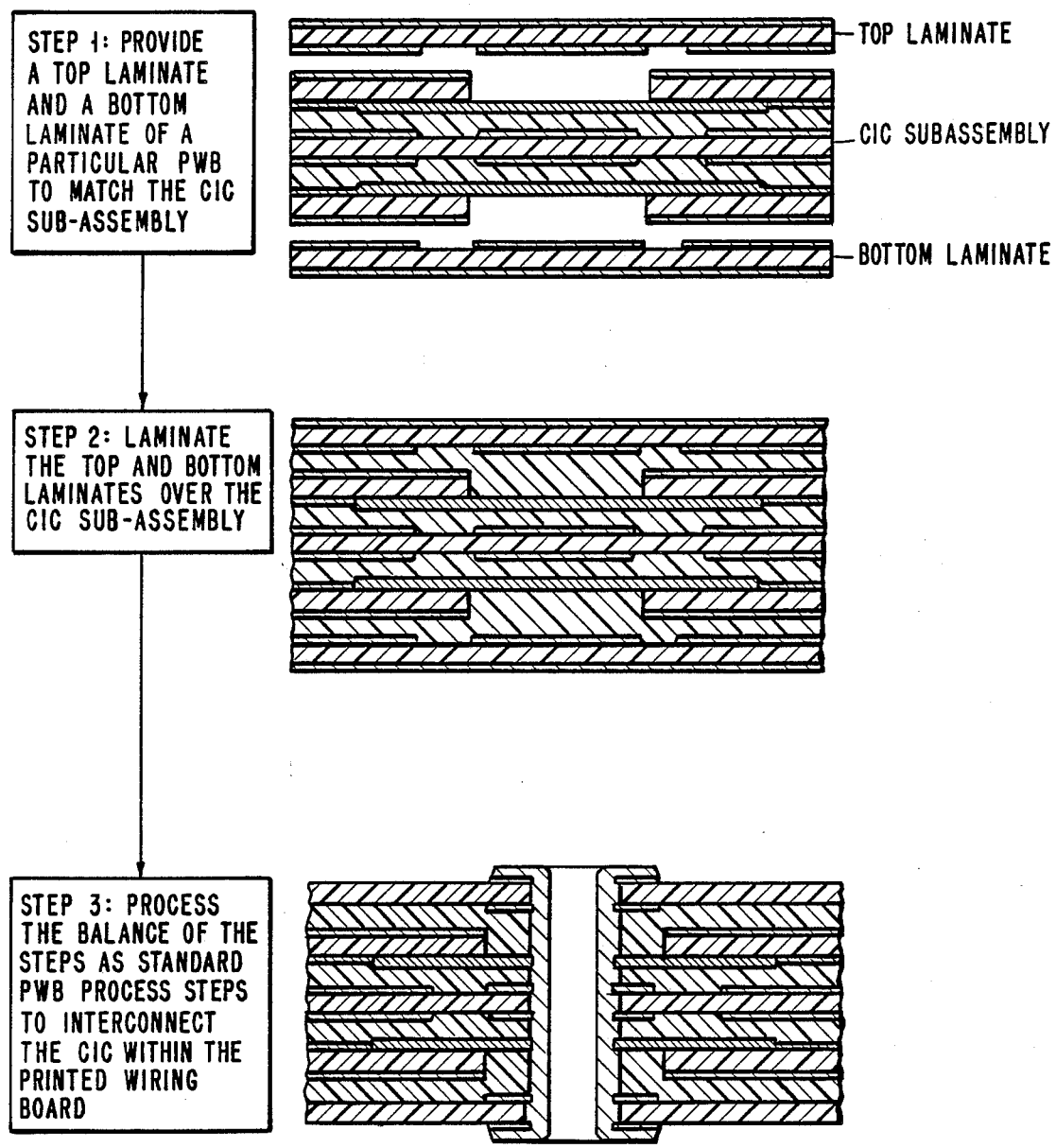
FIG. 5 is a flow chart representation of steps 1–3 in the method of this invention for constructing the multi-layered wiring board of the present invention, together with an illustrative cross-sectional view of the board of each step.

Now referring to FIG. 5 there is shown a flow chart of process steps of the present invention to laminate a sub-assembly containing Copper-Invar-Copper with copper and Invar selectively removed for fabrication within a printed wiring board. The steps include:

Step 1, provide one sub-assembly of a particular printed wiring board that contains pre-processed CIC and also provide pre-processed laminates with matching circuitry of that same printed wiring board. Step 2, laminate the pre-processed laminates over the sub-assembly of a particular printed wiring board. Step 3, process the printed wiring board through standard processes of drilling, plating, photoetch, etc. to create a particular printed wiring board as shown in FIG. 1 containing the invention.

In operation, a method and printed wiring board of the present invention that provides for the precise use of thermal expansion controlling metals such as Invar or Covar within a printed wiring board for the explicit advantages of: containing the thermal expansion of the PWB to match that of the surface mount devices soldered thereon and the replacement of standard copper ground and/or power plane circuitry with CIC to maintain a specified thickness of the PWB and also to electrically isolate circuits located between the CIC while maintaining a highly reliable plated throughhole using proven and known PWB technology that will pass thermal shock and thermal cycle reliability tests. This is accomplished when the copper is selectively removed and a gold barrier layer is selectively electroplated to the exposed Invar and copper is re-deposited over the gold. The CIC containing the gold barrier layer is further processed when the CIC is laminated over the circuits of a matching printed wiring board forming a sub-assembly that allows further processing to selectively remove the copper and Invar by etching down to the gold with ferric chloride etchant. A copper/gold pad is thereby retained that is electrically connected to the Invar through the roll-bond process of copper to Invar during the manufacture of the CIC. The sub-assembly is further processed by laminating matching laminates of the PWB over the sub-assembly with the gold/copper pad matching the pads of the outer laminates of the particular PWB. This allows use of standard PWB process technology that is highly reliable for the aforementioned reasons.

Throughout this description of the invention, several materials have been specifically discussed as preferred materials, it is understood that alternate materials having compatible characteristics may be substituted. When copper or Invar have been mentioned it is understood that other materials having similar electrical and thermal properties could be substituted. Likewise, when gold has been mentioned as a preferred material it is understood that other noble metals having similar ionization properties could be substituted. The alkaline based etchants mentioned herein can be substituted by any material which etches the copper, or a substitute there of, relatively easier than the Invar, or a substitute thereof. Where ferric chloride etchants have been discussed it is understood that other materials which are capable of easily etching copper and Invar, or there substitutes, as compared with etching gold or its substitutes, could be substituted.

It is thought that the method and apparatus of the present invention and many of their intended advantages, will be understood from the foregoing description, and it will be apparent that the various changes may be made in the form, construction, and arrangement of the parts thereof, without departing from the spirit and scope of the invention, or sacrificing all of their material advantages, the forms hereinbefore being merely preferred or exemplary embodiments thereof. It is the intention of the appended claims to cover all of such changes.

We claim:

1. A multi-layered printed wiring board comprising:
   a. a metallic core for controlling thermal expansion having a top side, bottom side and a plurality of holes therein;
   b. a noble metal layer disposed on the bottom side of the metallic core for inhibiting etching beyond said metallic core;
   c. a top side conductive layer disposed upon the top side of the metallic core;
   d. a bottom side conductive layer disposed upon the noble metal layer;
   e. a top side printed wiring board disposed upon the top side conductive layer; and
   f. a bottom side printed wiring board disposed upon the bottom side conductive layer.

2. A multi-layered printed wiring board of claim 1, further comprising; the metallic core being a metal selected from the group consisting of iron, Invar, and Covar.

3. A multi layered printed wiring board of claim 2 wherein the noble metal layer is gold.

4. A multi layered printed wiring board of claim 3 wherein the top side conductive layer is copper.

5. A multi-layered printed wiring board of claim 1 wheren the noble metal layer is gold.

6. A multi-layered printed wiring board of claim 1 wherein the top side conductive layer is copper.

* * * * *